(12) United States Patent
Samuels et al.

(10) Patent No.: US 10,854,306 B1
(45) Date of Patent: Dec. 1, 2020

(54) COMMON-GATE COMPARATOR AND FUSE READER

(71) Applicant: Analog Devices, Inc., Norwood, MA (US)

(72) Inventors: Howard R. Samuels, Newton, MA (US); Long Pham, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/576,216

(22) Filed: Sep. 19, 2019

(51) Int. Cl.
| | |
|---|---|
| *G11C 17/18* | (2006.01) |
| *G11C 7/06* | (2006.01) |
| *G11C 7/10* | (2006.01) |
| *G11C 17/16* | (2006.01) |
| *G11C 7/08* | (2006.01) |
| G11C 29/02 | (2006.01) |

(52) U.S. Cl.
CPC .............. *G11C 17/16* (2013.01); *G11C 7/062* (2013.01); *G11C 7/08* (2013.01); *G11C 17/18* (2013.01); G11C 29/027 (2013.01)

(58) Field of Classification Search
CPC ........... G11C 17/16; G11C 7/062; G11C 7/08; G11C 17/18
USPC .......................................................... 365/96
See application file for complete search history.

(56) References Cited

U.S. PATENT DOCUMENTS

| | | | | |
|---|---|---|---|---|
| 4,064,405 | A | * | 12/1977 | Cricchi ............ H03K 19/01721 326/34 |
| 5,565,813 | A | | 10/1996 | Connell et al. |
| 6,320,363 | B1 | * | 11/2001 | Oglesbee ................ G05F 1/613 323/274 |
| 6,803,555 | B1 | | 10/2004 | Parrish et al. |

(Continued)

FOREIGN PATENT DOCUMENTS

| | | |
|---|---|---|
| CN | 102629993 A | 8/2012 |
| CN | 104541449 A | 4/2015 |

(Continued)

OTHER PUBLICATIONS

Srinivasan, Venkatesh, et al., "A Precision CMOS Amplifier Using Floating-Gate Transistors for Offset Cancellation", IEEE Journal of Solid-State Circuits, 42(2), (Feb. 2007), 280-290.

(Continued)

*Primary Examiner* — Ly D Pham
(74) *Attorney, Agent, or Firm* — Schwegman Lundberg & Woessner, P.A.

(57) ABSTRACT

A state of one or more fuses can be determined using a common-gate FET device to read reference information and test information from a fuse bank. In an example, the FET device can be selectively diode-connected using a first switch that responds to a control signal, and a signal-storing capacitor can be connected to the gate terminal of the FET device. The capacitor can store information about a reference signal when the first switch is closed and a first input signal is applied at a source node of the FET device. When the first switch is open, a second input signal can be applied (Continued)

at the source node of the FET device, and an output signal at the drain node of the FET device can indicate a magnitude relationship between the first input signal and the reference signal. In an example, the second input signal can indicate a state of a fuse.

17 Claims, 10 Drawing Sheets

(56) References Cited

U.S. PATENT DOCUMENTS

| | | | |
|---|---|---|---|
| 7,030,641 B1 | 4/2006 | Tang et al. | |
| 7,327,595 B2 * | 2/2008 | Audy | G11C 17/16 365/225.7 |
| 7,466,166 B2 | 12/2008 | Date et al. | |
| 7,593,248 B2 * | 9/2009 | Xu | G11C 17/16 365/185.05 |
| 7,737,785 B2 | 6/2010 | Stuecke et al. | |
| 8,710,505 B2 | 4/2014 | Kimura | |
| 8,803,721 B1 | 8/2014 | Boles et al. | |
| 8,878,589 B2 | 11/2014 | Kimura | |
| 2004/0085115 A1 | 5/2004 | Fujiyoshi et al. | |
| 2004/0095159 A1 | 5/2004 | Kimura | |
| 2008/0001636 A1 * | 1/2008 | Can | H03K 5/2481 327/65 |
| 2010/0066450 A1 * | 3/2010 | Palmer | H04L 25/0278 330/261 |
| 2011/0230375 A1 * | 9/2011 | Rothberg | H01L 21/306 506/39 |
| 2012/0020139 A1 * | 1/2012 | Samuels | G11C 29/50 365/96 |
| 2012/0057261 A1 * | 3/2012 | Poulton | H04B 3/54 361/56 |
| 2012/0092916 A1 * | 4/2012 | Lee | G11C 29/027 365/96 |
| 2019/0115880 A1 * | 4/2019 | Kim | H03F 3/72 |
| 2020/0025807 A1 * | 1/2020 | Adami | G01R 19/16538 |

FOREIGN PATENT DOCUMENTS

| | | | |
|---|---|---|---|
| JP | 05300432 A | * | 11/1993 |
| JP | 07245533 A | * | 9/1995 |

OTHER PUBLICATIONS

Wegmann, G., et al., "Basic principles of accurate dynamic current mirrors", IEEE Proceedings, vol. 137, Part G, No. 2, (Apr. 1990), 95-100.

Wegmann, George, et al., "Analysis and Improvements of Accurate Dynamic Current Mirrors", IEEE Journal of Solid-State Circuits, 25(3), (Jun. 1990), 699-706.

Wong, Yanyi Liu, et al., "A Floating-Gate Comparator With Automatic Offset Adaptation for 10-bit Data Conversion", IEEE Transactions on Circuits and Systems—I: Regular Papers, 52(7), (Jul. 2005), 1316-1326.

* cited by examiner

COMMON-GATE COMPARATOR AND FUSE READER

BACKGROUND

Programmable fuses can be used in non-volatile memory devices for long-term storage, device identification, or other uses. In an example of a memory device, a blown fuse can represent a logic 1 and an intact or unblown fuse can represent a logic 0 (or vice-versa). In an example, a fuse can have a non-negligible resistance characteristic. A state of a fuse, such as whether a fuse is blown or intact, can be determined by providing a current to a circuit that includes the fuse. In an example, a voltage is generated in response to a current being provided through the non-negligible resistance of a fuse. A magnitude of the voltage can be compared with a threshold voltage to determine whether the fuse is blown or intact.

Various circuitry can be used to set or check a fuse status. For example, a programmable fuse can be connected between a supply voltage VDD and a drain terminal of a FET device. In response to a programming command signal provided at a gate of the FET device, the FET device can conduct an amount of current that is large enough to blow the programmable fuse. A second FET device can be connected in parallel with the first FET device. In response to a bias voltage provided at a gate of the second FET device, the second FET device can conduct a test current through the programmable fuse and a resulting voltage can be measured. A magnitude of the resulting voltage can be compared against a specified threshold voltage and a result of the comparison can be used to indicate that the fuse is blown or intact. For example, a higher voltage signal can correspond to a fuse with a greater resistance, and the fuse can be considered to be blown. A lower voltage signal can correspond to a fuse with a lesser resistance, and the fuse can be considered to be intact. This technique can be generally reliable if a resistance characteristic of a fuse is substantially constant over its operational life. However, in some cases, fuse "regrowth" can occur, or an apparent resistance of a fuse can change over time in response to different environmental or other use conditions.

In an example, characteristics or components of a fuse status measuring circuit can vary, for example due to variation in device manufacturing processes, or due to operating temperature changes, or due to changes or other drift in the measurement circuitry or in one or more signals provided to the circuitry. These and other changes in fuse resistance or changes in a measurement circuit can present misinformation about a fuse status.

BRIEF SUMMARY

The present inventors have recognized that a problem to be solved can include providing a measurement circuit or comparator circuit that can read a test signal and compare the test signal to a reference signal. In an example, the problem can include providing a fuse reader, or other sensor or signal reader, that is accurate over device manufacturing process variations and over changes in environmental conditions during use, such as changes in temperature. In an example, the problem can include using a FET device in a measurement circuit or comparator circuit. The problem can include managing variation in characteristics of the FET device, for example, variation in a gate-source threshold voltage (Vgs_th) or turn-on voltage characteristic of the FET device.

In an example, the problem to be solved can include providing a fuse reader that is configured to use a FET device to read status information about one or more fuses using a minimum amount of current. The fuses can have a characteristic impedance or resistance that can be compared against a reference resistance, for example, a reference around 1 kΩ. In this example, for resistances less than 1 kΩ, a fuse can be considered to be intact, and for resistances greater than 1 kΩ), a fuse can be considered to be blown. In an example, a magnitude of a current signal available to measure a fuse can be about 16 microamps. Therefore, for a resistance measured near the threshold condition, the resulting voltage can be about 16 millivolts if a standard FET device is used to measure the resulting voltage, then a turn-on threshold voltage of the FET device can be substantially larger than the resulting voltage. Furthermore, in some examples, a magnitude of process and temperature-related effects on the turn-on or threshold voltage of a PET device can be around the same magnitude as a measured test voltage a fuse.

In an example, the present subject matter can provide a solution to these and other problems. The solution can include using a FET device in a common-gate configuration. The FET device can be configured to measure reference signal information and compare it against a test signal to provide a test result. In an example, the FET device can be configured such that a turn-on voltage of the PET is effectively canceled out between reference and test signal measurements, thereby providing a measurement circuit or comparator circuit that can be substantially stable over changes in temperature or over effects of process variation on the measurement circuit.

In an example, the solution can include or use a common-gate amplifier circuit configured to provide information about a relationship between an input signal at an input node and a reference signal. The input signal at the input node can include a voltage signal measured from, for example, one or more fuses. The amplifier circuit can include a first PET device, a first switch (such as can include a different FET device or other switch device), a second switch (such as can include a different FET device or other switch device), a third switch (such as can include a different PET device or other switch device), and a capacitor. In an example, the first FET device can include a first node (e.g., at a drain terminal of the device), a second node (e.g., at a source terminal of the device), and a third node (e.g., at a gate terminal of the device). The amplifier circuit can include an amplifier output node at the first node of the first FET device. The first switch can be configured to couple the first node and the gate node of the first PET device when an auto-zero signal is asserted, and the first switch can be configured to decouple the first node and the gate node of the first FET device when the auto-zero signal is unasserted. The second switch can be configured to couple the second node of the first FET device to a reference voltage source when the auto-zero signal is asserted and the second switch can be configured to decouple the second node from the reference voltage source when the auto-zero signal is unasserted. The third switch can be configured to couple the second node of the first FET device to the input node when a read signal is asserted and the third switch can be configured to decouple the second node from the input node when the read signal is unasserted. The capacitor can be configured to store information about the reference signal at the gate node of the first FET. The reference signal can be set or influenced by the reference voltage source when the auto-zero signal is asserted. In an example, when the auto-zero signal is unasserted, then an output signal at the output node can indicate a magnitude relationship between the input signal at the second node and the reference signal.

In an example, the solution can include or use a method for determining a relationship between a first input signal and a second input signal using a common-gate FET device. The method can include coupling drain and gate nodes of the FET device using a first switch, and the first switch can be responsive to an auto-zero signal. While the first input signal is applied to an input source node of the FET device, the method can include storing information about a reference voltage, such as from the first input signal, using a capacitor coupled to the gate node of the FET device. The method can further include decoupling the drain and gate nodes of the FET device using the first switch and, while the second input signal is applied to the input source node of the FET device, receiving an output signal from the drain node of the FET device. In this example, a magnitude of the output signal can indicate a magnitude relationship between the first and second input signals.

This Summary is intended to provide an overview of the subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The following description includes examples of systems, methods, apparatuses, and devices for reading or comparing information about one or more signals. In an example, the description includes systems, methods, apparatuses, and devices for measuring a fuse status or for measuring other information from a sensor or other device. Throughout the description, reference is made to the accompanying drawings, which form a part of the detailed description. The drawings show, by way of illustration, embodiments in which the inventions disclosed herein can be practiced. These embodiments are generally referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In an example, the description includes a programmable fuse state detector or fuse reader. A fuse state can be determined, for example, by comparing a magnitude of a voltage developed across the fuse with a specified threshold voltage magnitude or reference voltage magnitude. In an example, the systems and methods discussed herein can include multiple different operating modes or measurement phases, such as can be used to determine whether a fuse is blown or intact. Generally, the figures illustrate the concepts discussed herein using field-effect transistor (FET) devices. In other implementations, bipolar transistors can be used.

Figure 1:
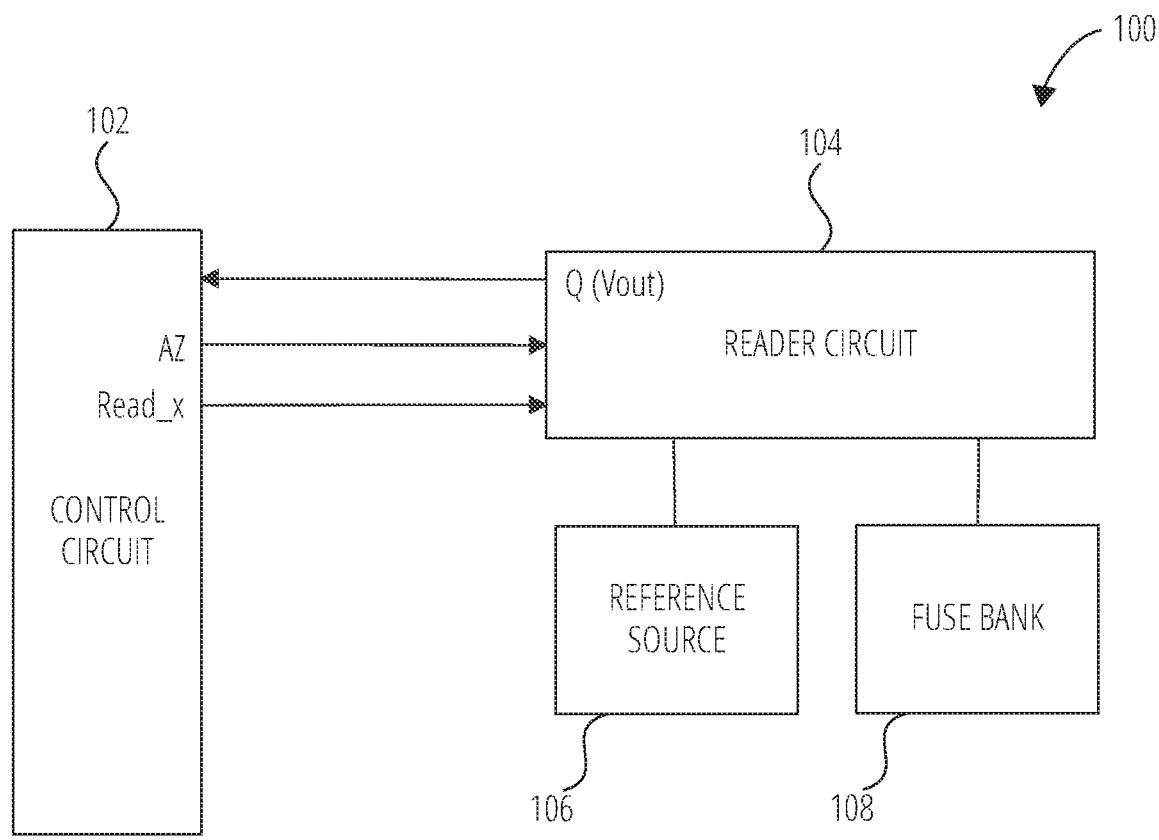
FIG. 1 illustrates generally a fuse reader system in accordance with one embodiment.

FIG. 1 illustrates generally an example of a fuse reader system 100. The fuse reader system 100 can include a control circuit 102, a reader circuit 104, a reference source 106, and a fuse bank 108. Operation of the fuse reader system 100, according to an example, is described below in the discussion of FIG. 2 and elsewhere. Under operations or control signals from the control circuit 102, the fuse reader system 100 can be configured to read status information about one or more fuses in the fuse bank 108. Status information can include, for example, state information about whether a fuse is blown, intact, or in an intermediate or indeterminate state. In an example, a blown fuse can be an open circuit or can be represented by a relatively high resistance characteristic (e.g., about 1 kΩ or more). An intact fuse can be a short circuit, shunt, or can be represented by a relatively low resistance characteristic (e.g., about 100Ω or less).

In an example, the control circuit 102 can include a processor circuit or other general purpose or purpose-built processor or controller configured to manage one or more aspects of the fuse reader system 100. The control circuit 102 can be one integrated structure or can comprise multiple processors or controllers that are configured to work together to perform one or more operations in the fuse reader system 100.

In an example, the control circuit 102 is configured to generate or provide an auto-zero signal AZ. The auto-zero signal AZ can be asserted to control the fuse reader system 100 or the reader circuit 104 to "zero" itself, or set or update a reference value for use by the fuse reader system 100. In an example, the auto-zero signal AZ controls the fuse reader system 100 to set a reference value against which one or more other signal values or test signals can be compared. Such other signal values can include, for example, a voltage magnitude representative of a fuse status, a voltage magnitude representative of a sensor value, or other value. In an example, the reference value can be received or read from the reference source 106 when the auto-zero signal AZ is asserted or in response to the auto-zero signal AZ. In an example, the reference source 106 can include one or more fixed or variable resistors or other signal generators that can be used to provide a reference signal.

In an example, the control circuit 102 can be configured to generate or to provide a read signal Read_x. The control circuit 102 can provide the read signal Read_x to the reader circuit 104 and the read signal Read_x can indicate an address, or other identifier, of a particular signal or signal channel to be read or sampled. In an example, the read signal Read_x can indicate a particular one of multiple fuses to read. For example, a first read signal Read_0 can indicate a first fuse to read, a second read signal Read_1 can indicate a different second fuse to read, and so on. In an example, more than one read signal can be asserted concurrently, for example, when multiple channels of information or multiple fuses are read at the same time.

In an example, the control circuit 102 can assert the auto-zero signal AZ and the read signal Read_x in a time-interleaved and non-overlapping manner, That is, the auto-zero signal AZ can be asserted at times when the read signal Read_x is not asserted and vice-versa. In an example, a blanking period can be provided between assertions of the auto-zero signal AZ and the read signal Read_x. In an example, multiple read signals can be asserted concurrently or can be asserted sequentially in a non-overlapping manner.

In an example, the control circuit 102 can be configured to receive an output signal Q, such as from the reader circuit 104. The output signal Q can represent a fuse status, a sensor status or value, or other information. In an example, the output signal Q can include information about a relationship between a reference value, such as measured from the reference source 106, and a test value, such as measured from a fuse in the fuse bank 108.

In an example, the reader circuit 104 can be coupled to the control circuit 102, and the reader circuit 104 can be coupled to the reference source 106 and the fuse bank 108. The reader circuit 104 can include circuitry responsive to the auto-zero signal AZ and the read signal Read_x. For example, in response to receiving the auto-zero signal AZ, the reader circuit 104 can be configured to read a reference signal or receive information about a reference value from the reference source 106. In response to receiving the read signal Read_x, the reader circuit 104 can then be configured to read or receive a test signal from the fuse bank 108 or from another source. In an example, the reader circuit 104 can provide information about a magnitude relationship between the reference signal and the test signal. For example, the output signal Q, such as can be provided to the control circuit 102 or to another circuit or device outside of the fuse reader system 100, can include information about the magnitude relationship. In an example, the output signal Q can be a binary signal configured to indicate whether a particular fuse in the fuse bank 108 is intact or not.

Figure 2:
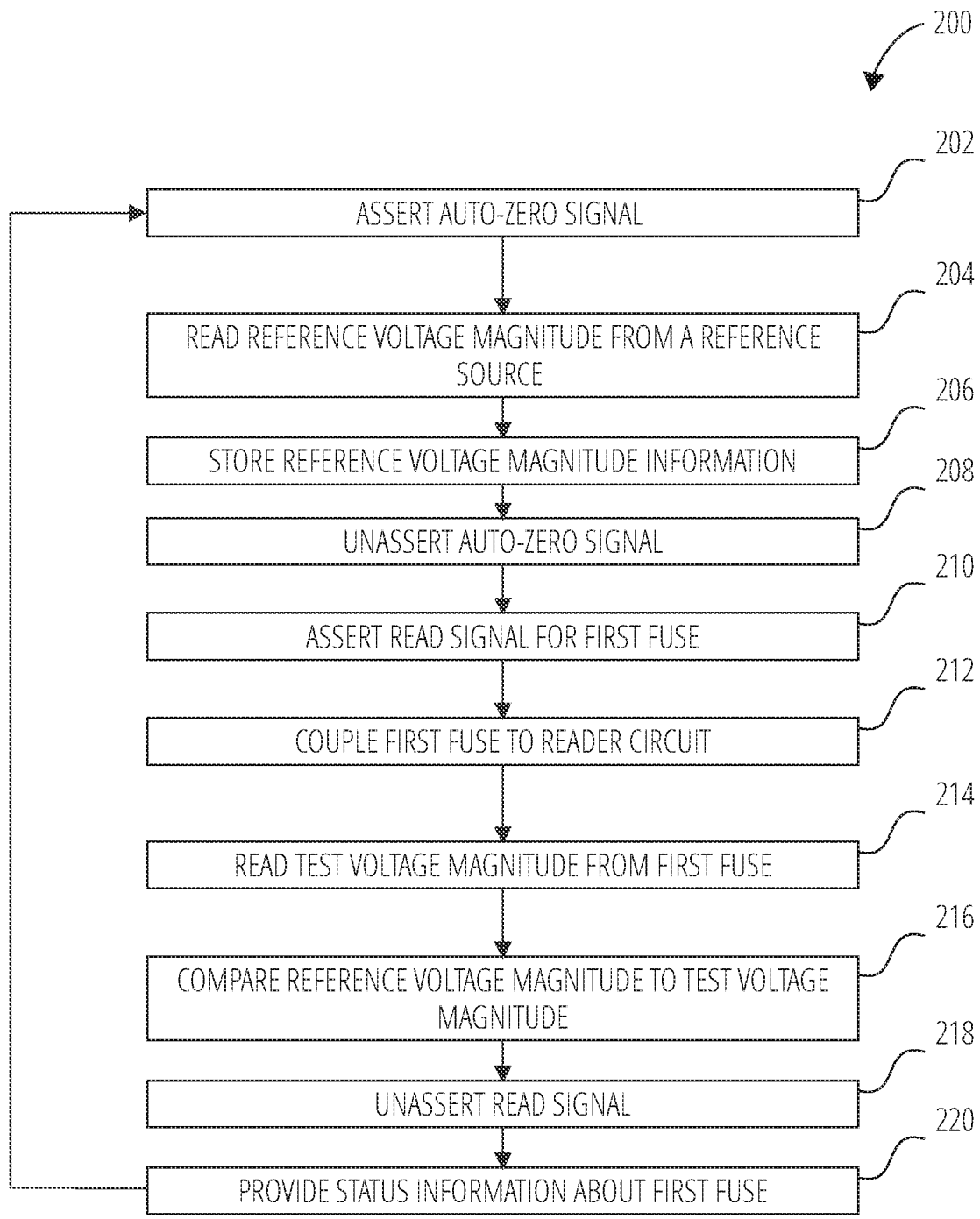
FIG. 2 illustrates generally a first method in accordance with one embodiment.

FIG. 2 illustrates generally an example of a first method 200 that can include providing status information about a fuse using a fuse reader system, such as using the fuse reader system 100 from the example of FIG. 1. In an example, the first method 200 can include a reference or auto-zero phase and a test or measurement phase, and the phases can be performed to measure fuse state information about one or more fuses. The first method 200 can begin by providing power to the fuse reader system.

In an example, the reference phase or auto-zero phase can begin at block 202. In block 202, the first method 200 can include asserting an auto-zero signal AZ. In an example, block 202 can include or use the control circuit 102 or another controller to generate or provide the auto-zero signal AZ. At block 204 and in response to the auto-zero signal AZ, reference information can be read or received from a reference generator, such as from the reference source 106. In an example, block 204 can include reading a reference voltage signal or signal magnitude from the reference source 106. Block 206 can include storing the reference information. In an example, block 206 can include using a capacitor or other memory circuit to store information about a voltage or signal magnitude. At block 208, the auto-zero signal AZ can be unasserted. The stored reference information, such as from block 206, can be maintained after the auto-zero signal AZ is unasserted in block 208.

In an example, the test phase or measurement phase can begin at block 210. In block 210, the first method 200 can include asserting a read signal Read_0, such as can indicate that information about a first fuse is to be read or sampled. In an example, block 210 can include using the control circuit 102 to generate or provide the read signal. Block 212 can include coupling the first fuse to a reader such as the reader circuit 104, and block 214 can include reading a test signal from the first fuse. In an example, block 214 can include measuring a test voltage signal magnitude. The test voltage signal magnitude can represent a fuse status or a resistance characteristic of the first fuse.

In an example, at block 216, the first method 200 can include comparing reference information, such as received at block 204, to test information, such as received at block 214. In an example, the comparison can be performed at least in part using a common-gate FET device, such as described in the examples herein. In block 218, the read signal Read_0 can be unasserted and, in block 220, an output signal or status information about the first fuse can be provided. Following block 220, the first method 200 can optionally return to block 202 or the first method 200 can terminate by disconnecting power from the fuse reader system. The first method 200 can return to block 202 to read information from the same first fuse, or the system can be configured to read information about a different fuse.

The status information provided in block 220 as the output signal Q can be provided, for example, from the reader circuit 104 to the control circuit 102. In an example, the status information from block 220 can include fuse state information about one or more fuses, and the fuse state information can be stored in a shadow RAM.

Figure 3:
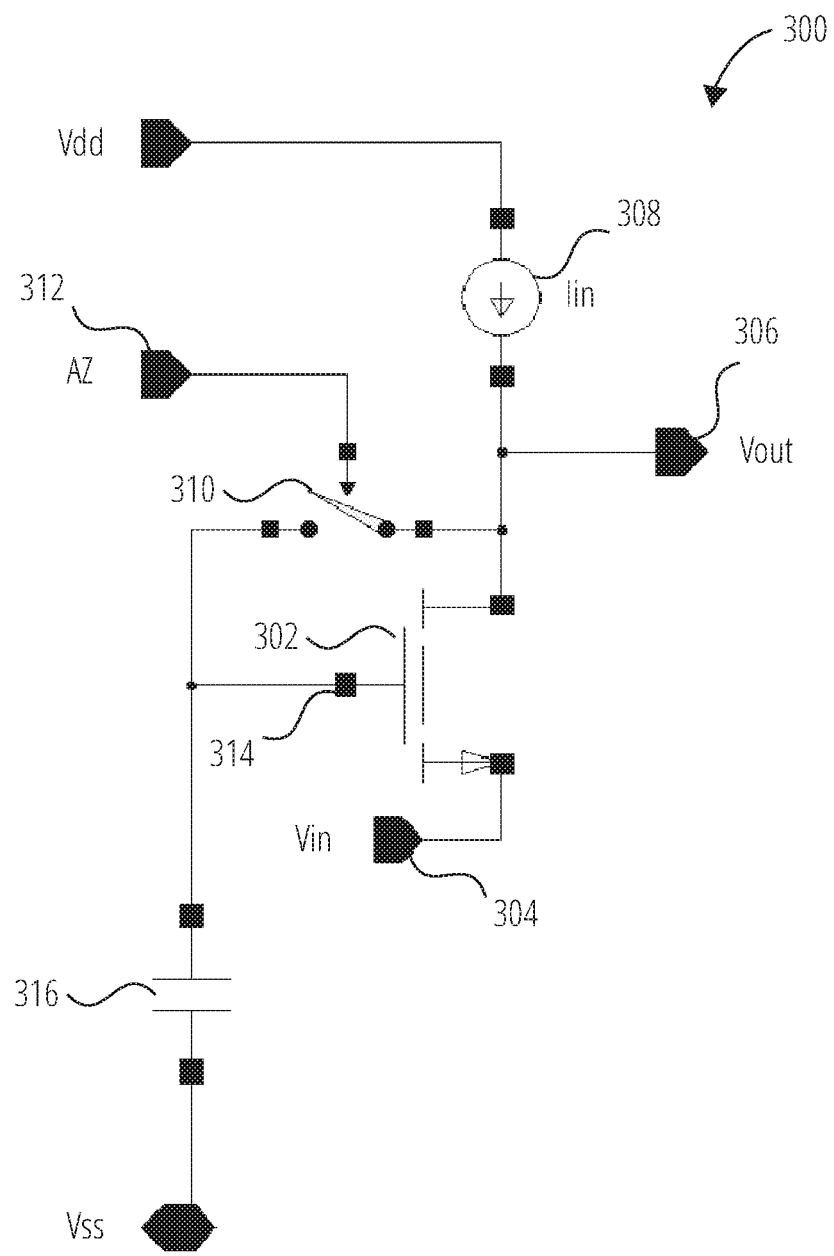
FIG. 3 illustrates generally a comparator using an NMOS amplifier in accordance with one embodiment.

FIG. 3 illustrates generally a comparator using an NMOS amplifier in accordance with one embodiment. The comparator of FIG. 3 can include a comparator 300. In an example, the comparator 300 can comprise a portion of the fuse reader system 100. The comparator 300 can include or use a first FET device 302 in a common-gate configuration. The example of FIG. 3 illustrates the first FET device 302 as an NMOS device, however, PMOS devices can similarly be used (see, for example, FIG. 5). In the example of FIG. 3, the source terminal of the first FET device 302 can be configured to receive an input, the drain terminal can be configured to provide an output, and the gate terminal can be coupled to ground or to a reference voltage source.

The first FET device 302 can have various FET characteristics such as a minimum threshold voltage or turn-on voltage Vgs_th, Such device characteristics can vary over manufacturing processes or use conditions, however, as shown below, such variations can be disregarded in use of the comparator 300. The illustrated examples herein show particular configurations of the source and drain terminals of the various FET devices, such as the first FET device 302. However, in some FET devices, the source and drain terminals can be interchanged to achieve the same or substantially the same results. Furthermore, the illustrated FET devices are shown as singular devices for simplicity and explanation. It is to be understood that the illustrated devices may, in practice, comprise multiple parallel devices or can include devices of different types (e.g., NMOS and PMOS) or different sizes, for example, for charge balancing purposes.

The comparator 300 can be configured to read an input signal Vin at a single-ended input node 304, such as at first and subsequent second times, and to provide an output signal Vout at a single-ended output node 306. The single-ended input node 304 can be coupled to the source terminal of the first PET device 302 and the single-ended output node 306 can be coupled to the drain terminal of the first PET device 302. The output signal Vout can indicate a relationship between Vin at the first time and Vin at the subsequent second time. In an example, the comparator 300 can include a current source 308 configured to provide a bias current to the first PET device 302.

The first PET device 302 includes drain, gate, and source terminals. The drain terminal can be selectively coupled to the gate terminal using a first switch 310. In an example, the first switch 310 can be controlled by the auto-zero signal AZ, such as can be received at an auto-zero input node 312, for example from the control circuit 102. In the example of FIG. 3, when the auto-zero signal AZ is asserted, then the first switch 310 can be closed to connect the drain and gate terminals of the first FET device 302, thereby providing the first FET device 302 as a diode-connected PET device. When the auto-zero signal AZ is unasserted, then the first switch 310 can be open and the drain and gate terminals of the first PET device 302 can be disconnected.

In the example of FIG. 3, the gate terminal of the first FET device 302 can be coupled to a control node 314. The control node 314 can be coupled to a first capacitor 316. The first capacitor 316 can be configured to store information about a gate voltage of the first PET device 302, that is, about a voltage at the control node 314. A capacitance characteristic of the first capacitor 316 can be selected according to use conditions. In an example, the first capacitor 316 can have a capacitance of about 1 picofarad.

In an example, when the auto-zero signal AZ is asserted and the first switch 310 is closed, information about the input signal Vin can be read from the single-ended input node 304. The information can be differently valued than the input signal Vin but can indicate a value of the input signal Vin. The information can be read at the control node 314 and stored using the first capacitor 316. In an example, the information can be a voltage value equal to a sum of the voltages of the input signal Vin and the gate-source threshold voltage Vgs_th of the first FET device 302. When the auto-zero signal AZ is asserted and the current source 308 provides a sufficient bias current to the drain terminal of the first FET device 302, then the first FET device 302 operates with a gate-source voltage Vgs that permits current to flow between the drain and source terminals of the device, and the voltage at the control node 314 can be stored using the first capacitor 316. After the voltage information is stored by the first capacitor 316, the first switch 310 can be opened, and current flow through the first FET device 302 can be stopped. That is, the first capacitor 316 can store information about a magnitude of the control node 314 voltage as measured when the first FET device 302 is on and the first capacitor 316 can maintain the stored voltage information when the first FET device 302 is off.

In an example, if the input signal Vin is read at a first time when the auto-zero signal AZ is asserted and then a value of the input signal Vin changes at a later second time when the auto-zero signal AZ is not asserted, then a state of the first FET device 302 can change. For example, if the input signal Vin increases in magnitude, then the first FET device 302 can remain off and the output signal Vout at the single-ended output node 306 can be a high value signal. If the input signal Vin decreases in magnitude, such as by a few millivolts or a fraction of a millivolt, then the first FET device 302 can turn on and the output signal Vout can change to a low value signal. In this example, the gate-source voltage Vgs of the first FET device 302 can be substantially the same during the first and later second times (e.g., when the auto-zero signal AZ is asserted and when it is not asserted), and accordingly the output signal Vout, or transitions in the output signal Vout, can be substantially independent of Vgs. In other words, in the example of FIG. 3, the first FET device 302 in a common-gate configuration provides a comparator 300 that can measure changes in the input signal Vin with the gate-source voltage of the first FET device 302 substantially eliminated as a potential source of measurement or comparison error.

In an example, as a time interval increases between assertion and de-assertion of the auto-zero signal AZ, 1/f noise of the first FET device 302 can add to an input voltage offset error of the amplifier circuit. This effect can be minimized by ensuring that a time interval between auto-zero and measurement phases is less than an inverse of the 1/f corner.

Figure 4:
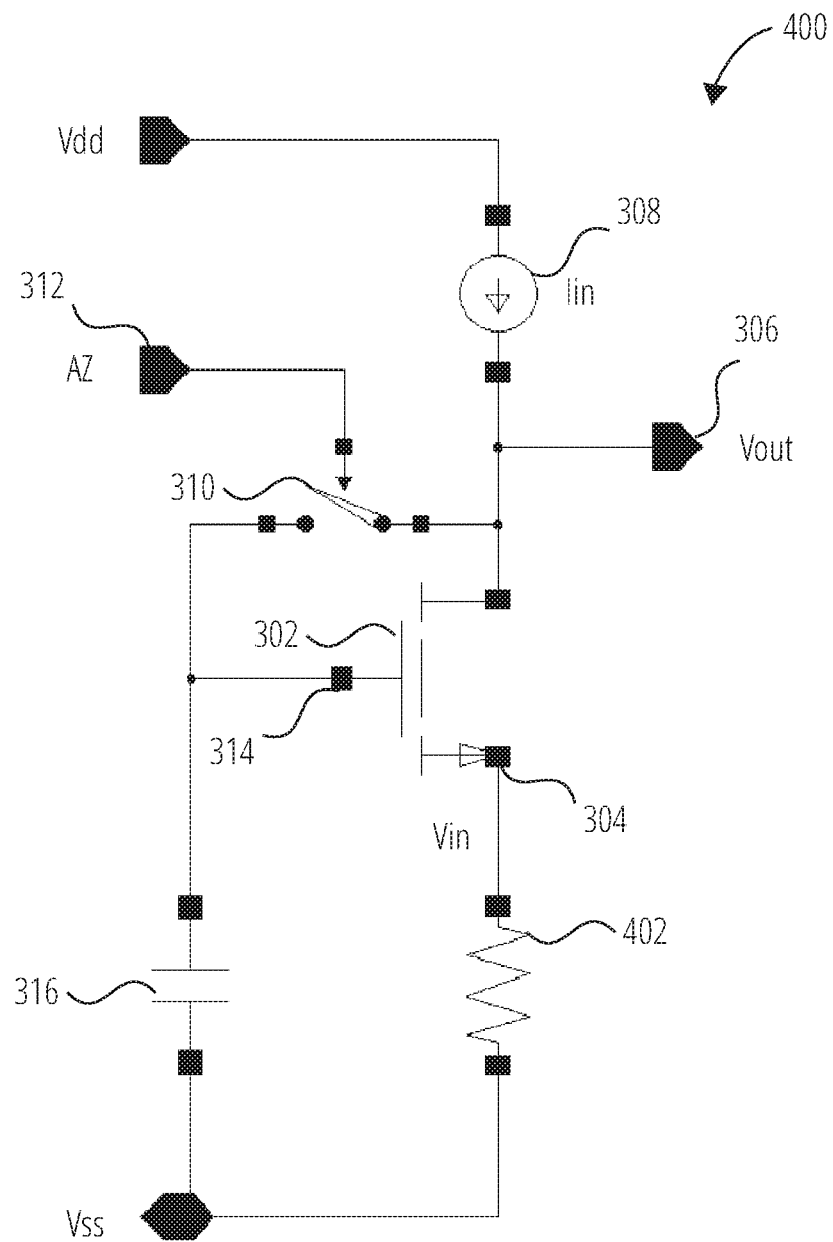
FIG. 4 illustrates generally a comparator configured to monitor a resistance characteristic over time in accordance with one embodiment.

FIG. 4 illustrates generally an example of a comparator 400. In an example, the comparator 400 can be configured to monitor a resistance characteristic over time. The example of FIG. 4 can include or use the comparator 300 from the example of FIG. 3 with a first resistor 402 coupled to the single-ended input node 304. In the resistor-comparator 400, the source terminal of the first FET device 302 can be coupled to the first resistor 402 such that the input signal Vin for the common-gate device represents a voltage on the first resistor 402.

In an example, when the auto-zero signal AZ is asserted, current flows from the current source 308 through the diode-connected first FET device 302 and into the first resistor 402, thereby providing a voltage at the single-ended input node 304. For example, if the first resistor 402 has a resistance of 1 kΩ and the current source 308 provides a bias current signal of 16 microamps, then the input signal Vin at the single-ended input node 304 can be 16 mV.

In an example, the first capacitor 316 can store information about the input signal Vin during an auto-zero phase when the auto-zero signal AZ is asserted. In an example, the first capacitor 316 can store a voltage that can be a sum of the input signal Vin and a gate-source voltage of the first FET device 302. In an example, a magnitude of a threshold voltage of the first FET device 302 can be substantially greater than the input signal Vin, but the threshold voltage can remain substantially constant when the auto-zero signal AZ is asserted and when it is not asserted. In an example, the threshold voltage is 0.5 V and the voltage stored by the first capacitor 316 during the auto-zero phase can be 0.5 V+0.016 V=0.516 V.

The auto-zero signal AZ can be de-asserted during a measurement phase and the voltage on the first capacitor 316 can remain substantially fixed. If a resistance characteristic of the first resistor 402 changes, for example following de-assertion of the auto-zero signal AZ or during the measurement phase, then an output signal of the resistor-comparator 400 can change. For example, if a resistance of the first resistor 402 decreases during the measurement phase, then the first FET device 302 can turn on and the output signal Vout can change from a high value to a relatively lower value.

In an example, the first resistor 402 can include a portion of a sensor or other voltage source to be measured using the resistor-comparator 400. For example, the first resistor 402 can comprise a temperature-sensing resistive device with a resistance characteristic that can change based on temperature. The resistor-comparator 400 can be used to sample information from the temperature-sensing resistive device during an auto-zero phase and then monitor the device for changes during a measurement phase.

Figure 5:
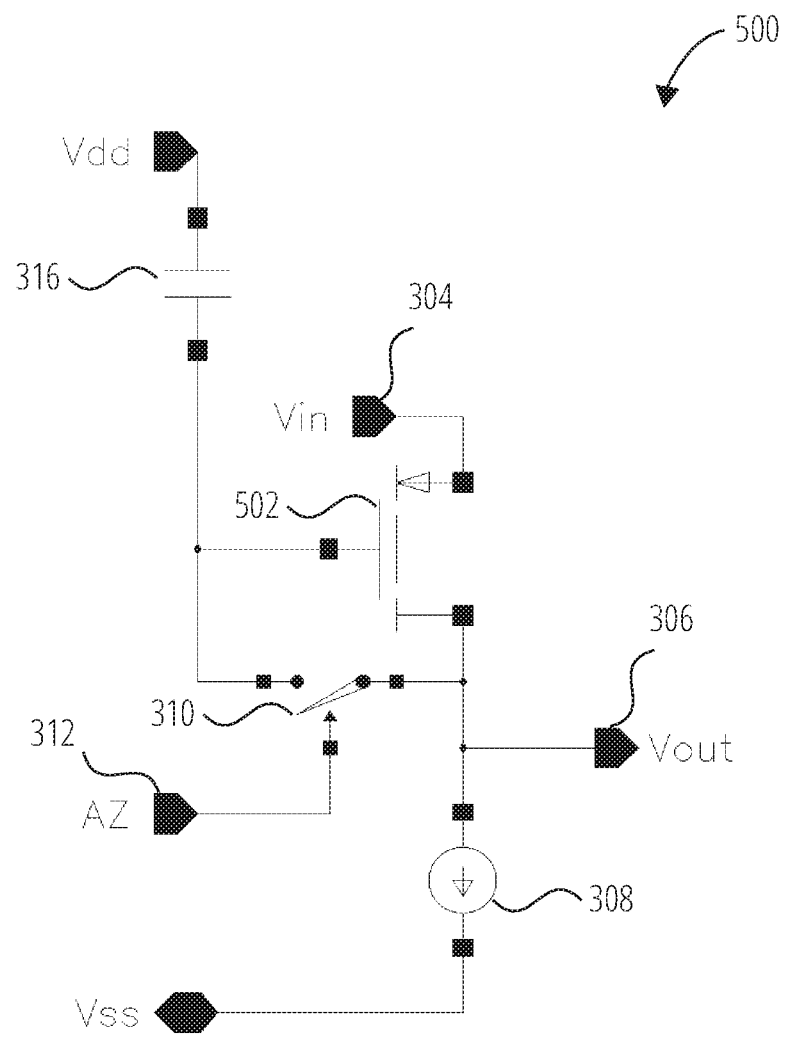
FIG. 5 illustrates generally a comparator using a PMOS amplifier in accordance with one embodiment.

FIG. 5 illustrates generally a comparator using a PMOS amplifier in accordance with one embodiment, in an example, FIG. 5 illustrates a comparator 500 similar to the comparator 300 of FIG. 3. For example, the comparator 500 can include a comparator with a common-gate PMOS device, whereas the comparator 300 of FIG. 3 can include a comparator with a common-gate NMOS device. The examples are substantially similar in operation however a sign of the output signals at the single-ended output node 306 can be different depending on the type of FET device used.

In an example, the comparator 500 can comprise a portion of the fuse reader system 100. The comparator 500 can include or use the PMOS FET device 502 in a common-gate configuration. In the example of FIG. 5, the source terminal of the PMS FET device 502 can be configured to receive the input, the drain terminal can be configured to provide the output, and the gate terminal can be coupled to the first capacitor 316. In an example, the first capacitor 316 can be coupled between the gate terminal of the PMOS FET device 502 and a supply rail, Vdd, such as to help mitigate supply noise. As similarly described above in the discussion of FIG. 3, the source and drain terminals of the PMOS FET device 502 can be interchanged to achieve the same or substantially the same function and results. Furthermore, the illustrated FET devices are shown as singular devices for simplicity and explanation. It is to be understood that the illustrated devices may, in practice, comprise multiple parallel devices or can include devices of different types (e.g., NMOS and PMOS) or different sizes, for example, for charge balancing purposes.

The comparator 500 can be configured to read an input signal Vin at the single-ended input node 304, such as at first and subsequent second times, and to provide the output signal Vout at the single-ended output node 306. The single-ended input node 304 can be coupled to the source terminal of the PMOS FET device 502 and the single-ended output node 306 can be coupled to the drain terminal of the PMOS FET device 502. The output signal Vout can indicate a relationship between Vin at the first time and Vin at the subsequent second time. Various other operating characteristics and behaviors of the comparator 500 are analogous to those described above in the discussion of the comparator 300 of FIG. 3.

Figure 6:
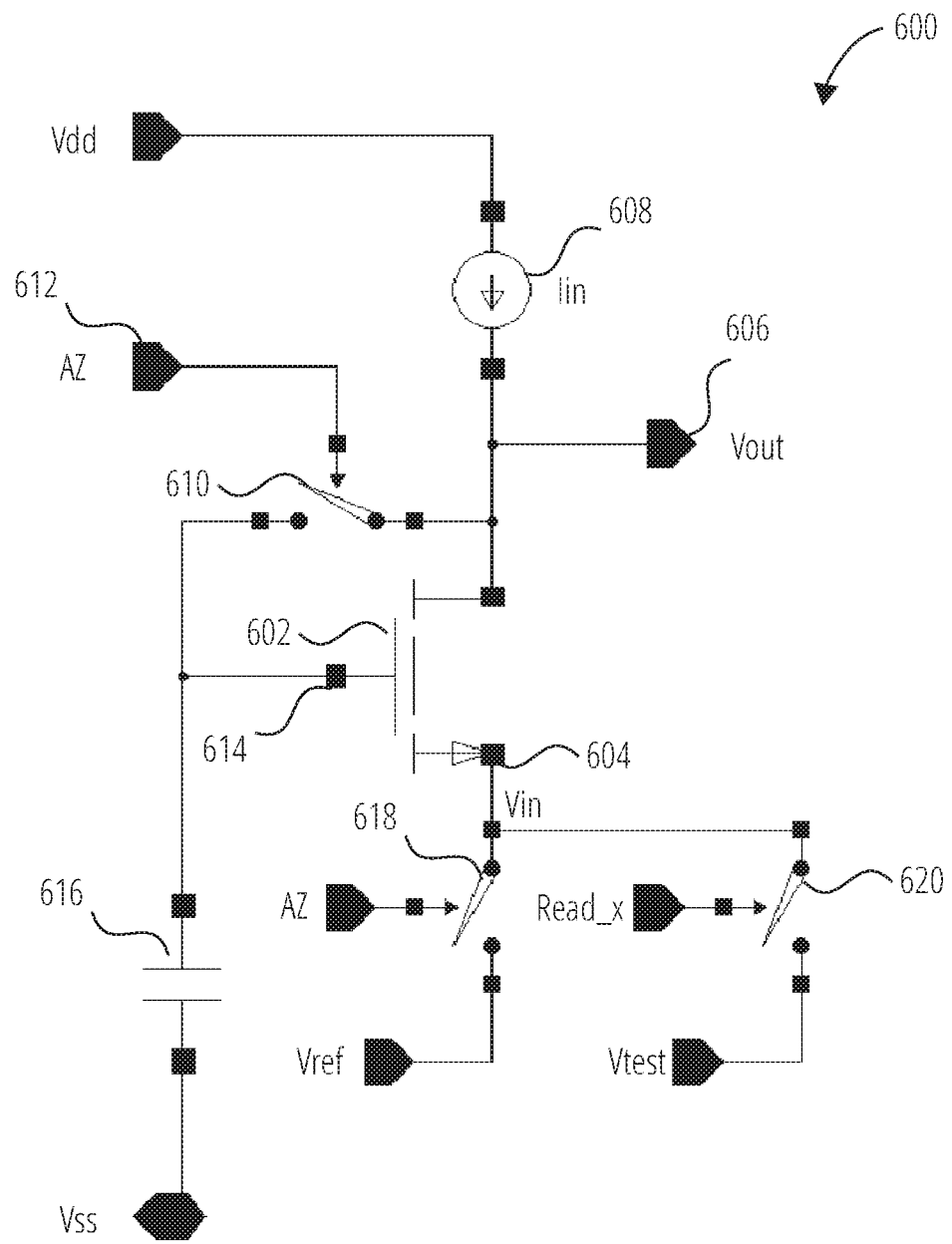
FIG. 6 illustrates generally a comparator in accordance with one embodiment.

FIG. 6 illustrates generally an example of a comparator 600. The example of FIG. 6 can include or use some elements from the comparator 300 from the example of FIG. 3 or from the resistor-comparator 400 from the example of FIG. 4, with like elements represented by like numerals. For example, the comparator 600 can include a second FET device 602 with drain, source, and gate terminals. In an example, the second FET device 602 can be a device having the same or similar characteristics to those of the first FET device 302. The second FET device 602 can be coupled to an output node 606 at the drain node, and can be coupled to an input node 604 at the source node. The drain and gate terminals of the second FET device 602 can be selectively coupled by a drain-gate switch 610 that responds to an auto-zero signal AZ at an auto-zero input node 612. For example, the drain-gate switch 610 can close when the auto-zero signal AZ is asserted to provide the second FET device 602 in a diode-connected configuration.

The second FET device 602 can receive a current bias signal from a second current source 608, for example, at the drain terminal of the second FET device 602. In an example, the second current source 608 can be a source having the same or similar characteristics to those of the current source 308 from the example of FIG. 3. The gate terminal of the second FET device 602 can be coupled to a second capacitor 616 and a FET control node 614. The second FET device 602 can have various FET device characteristics as similarly described above for the first FET device 302.

In FIG. 6, the second FET device 602 can be configured as a common-gate FET device or amplifier that is configured to receive an input signal at the input node 604 at the source terminal of the second FET device 602. In FIG. 6, the input node 604 can be coupled to a reference switch 618 and a first read switch 620. In an example, the reference switch 618 can be configured to selectively couple the input node 604 to a reference voltage source that provides a reference voltage signal Vref, or reference signal. The reference voltage source can include the reference source 106 from the example of FIG. 1.

The reference switch 618 can be configured to receive the auto-zero signal AZ such that the reference switch 618 and the drain-gate switch 610 operate in concert. For example, the reference switch 618 and the drain-gate switch 610 can be concurrently closed when the auto-zero signal AZ is asserted, and the reference switch 618 and the drain-gate switch 610 can be concurrently open when the auto-zero signal AZ is not asserted. In an example, the reference switch 618 and the drain-gate switch 610 can be configured to receive the auto-zero signal AZ from the control circuit 102.

In an example, the first read switch 620 can be configured to selectively couple the input node 604 to a test signal source that provides a test voltage signal Vtest. The test signal source can include the fuse bank 108 from the example of FIG. 1 or can include a different voltage source or test signal source configured to provide the test voltage signal Vtest. In an example, the first read switch 620 can be configured to receive a read signal Read_x, for example from the control circuit 102. In an example, the auto-zero signal AZ and the read signal Read_x can be asserted at different and non-overlapping times.

In an example, when the auto-zero signal AZ is asserted, current flows from the second current source 608 through the diode-connected second FET device 602 and through the reference switch 618. In an example, the reference switch 618 couples the input node 604 to a reference circuit or reference resistor from which the reference voltage signal Vref can be read. The second capacitor 616 can store information about the reference voltage signal Vref, for example the second capacitor 616 can store a voltage that can be substantially equal to a sum of a threshold or gate-source voltage of the second FET device 602 and the reference voltage signal Vref.

The auto-zero signal AZ can be de-asserted during a measurement phase and the voltage on the second capacitor 616 can remain substantially fixed. The read signal Read_x can be asserted to initiate the measurement phase or test phase, and a test voltage signal Vtest can be coupled to the input node 604 using the first read switch 620. If the voltage magnitude of Vtest differs from the voltage magnitude of Vref, then the output signal Vout can change. For example, if the voltage magnitude of Vtest is less than Vref, then the second FET device 602 can be turned on during the test phase and the output signal Vout can transition from a high value to a low value.

Figure 7:
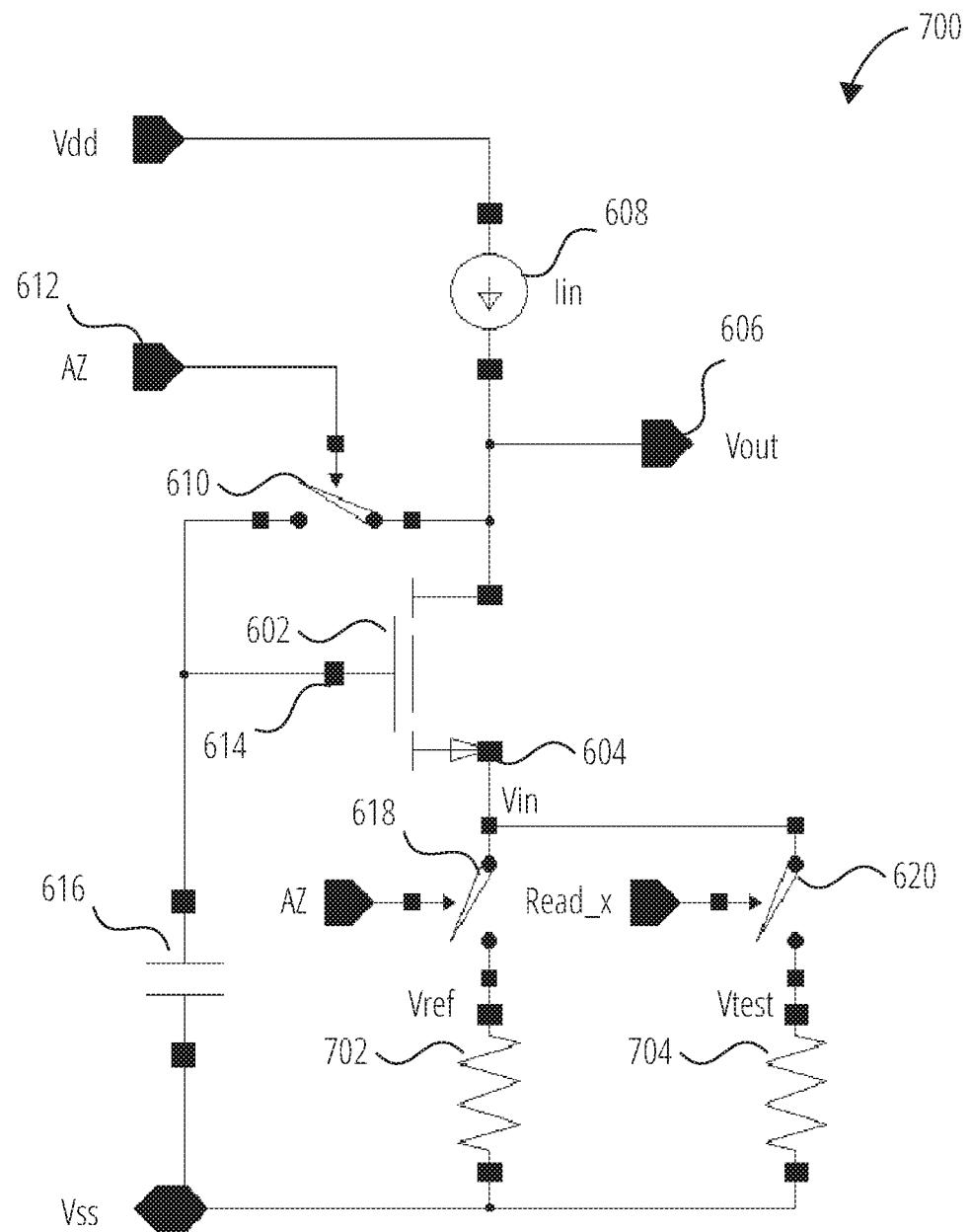
FIG. 7 illustrates generally a first fuse reader in accordance with one embodiment.

FIG. 7 illustrates generally an example of a first fuse reader 700. The example of FIG. 7 can include or use the comparator 600 from the example of FIG. 6, for example, with a reference resistor 702 coupled to the reference switch 618, and a first fuse 704 coupled to the first read switch 620.

In an example, when the auto-zero signal AZ is asserted, the reference switch 618 can be closed and the first read switch 620 can be open, and a current signal from the second current source 608 can flow through the second FET device 602, through the reference switch 618, and can thereby produce the reference voltage signal Vref on the reference resistor 702. Information about the reference voltage signal can be stored using the second capacitor 616.

When the auto-zero signal AZ is unasserted, the reference switch 618 and the drain-gate switch 610 can open. The read signal Read_x can then be asserted and, in response, the first read switch 620 can close to couple the input node 604 to the first fuse 704. Depending on a status or state of the first fuse 704, a current from the second current source 608 can be provided through the second FET device 602 and first fuse 704. For example, if the first fuse 704 is intact and therefore has a low resistance characteristic, such as less than the resistance characteristic of the reference resistor 702, then current from the second current source 608 can flow through the first read switch 620 and through the first fuse 704. The output signal Vout at the differential output node 606 can correspondingly transition from a high value to a low value signal. If, however, the first fuse 704 is blown, then the first fuse 704 can present a substantially greater resistance to current flowing from the input node 604 and the second FET device 602. For example, when the first fuse 704 is blown, its resistance can be greater than that of the reference resistor 702.

Figure 8:
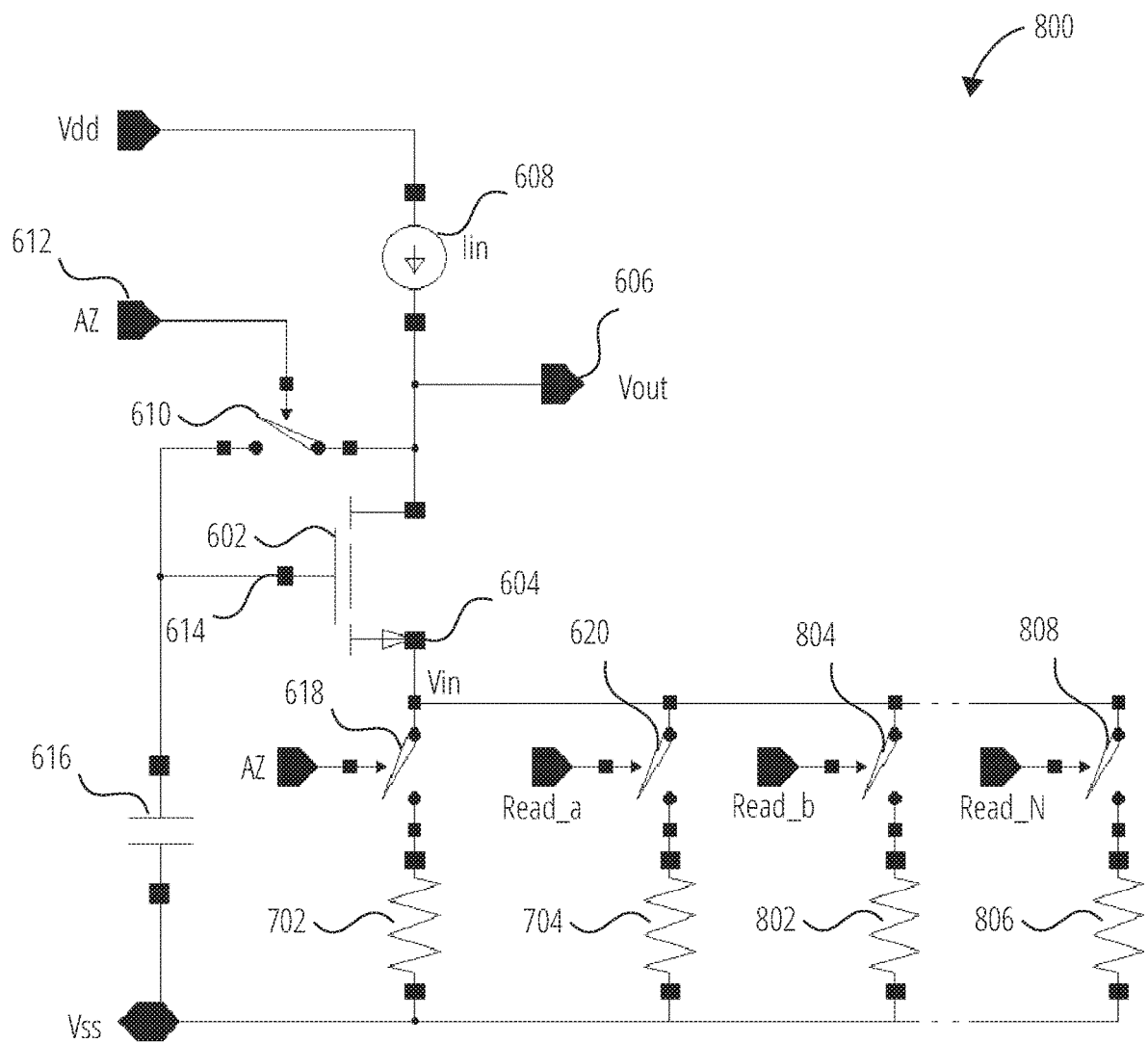
FIG. 8 illustrates generally a second fuse reader in accordance with one embodiment.

FIG. 8 illustrates generally an example of a second fuse reader 800. The example of FIG. 8 can include or use one or more portions of the first fuse reader 700 from the example of FIG. 7. For example, the second fuse reader 800 can include the reference resistor 702 coupled to the input node 604 using the reference switch 618 and the reference switch 618 can be operable based on the auto-zero signal AZ. The second fuse reader 800 can further include a bank of fuses, such as can include or use the first fuse 704, a second fuse 802, and a Nth fuse 806. In the example of FIG. 8, the second fuse 802 can be coupled to the input node 604 using a second read switch 804, and the Nth fuse 806 can be coupled to the input node 604 using a Nth read switch 808. Broken lines in the parallel traces that couple the Nth fuse 806 and Nth read switch 808 to the input node 604 indicate that additional fuses can optionally be used, and each additional fuse can include or use its own respective switch to couple it to the input node 604. In an example, the several fuses can comprise the fuse bank 108 from the example of FIG. 1.

In an example, the control circuit 102 can be configured to provide the auto-zero signal AZ and the various read signals Read_a, Read_b, and Read_N, such as to couple the reference resistor 702, the first fuse 704, the second fuse 802, and the Nth fuse 806, respectively, to the input node 604 at respective different times. For example, the reference resistor 702 can be coupled to the input node 604 during a reference phase or auto-zero phase.

Following the auto-zero phase and during a measurement phase or test phase, one or more of the fuses can be coupled, for example sequentially, to the input node 604 for measurement. In an example, the control circuit 102 can assert the read signals Read_a, Read_b, and Read_N at respective different times. In an example, the control circuit 102 can reassert the auto-zero signal AZ at various intervals, for example, between each fuse measurement or test measurement. In an example, the control circuit 102 can reassert the auto-zero signal AZ after two or more test measurements, or when a value of a control signal at the FET control node 614, such as corresponding to a voltage stored by the second capacitor 616, changes or is likely to have changed by more than a specified threshold amount.

Figure 9:
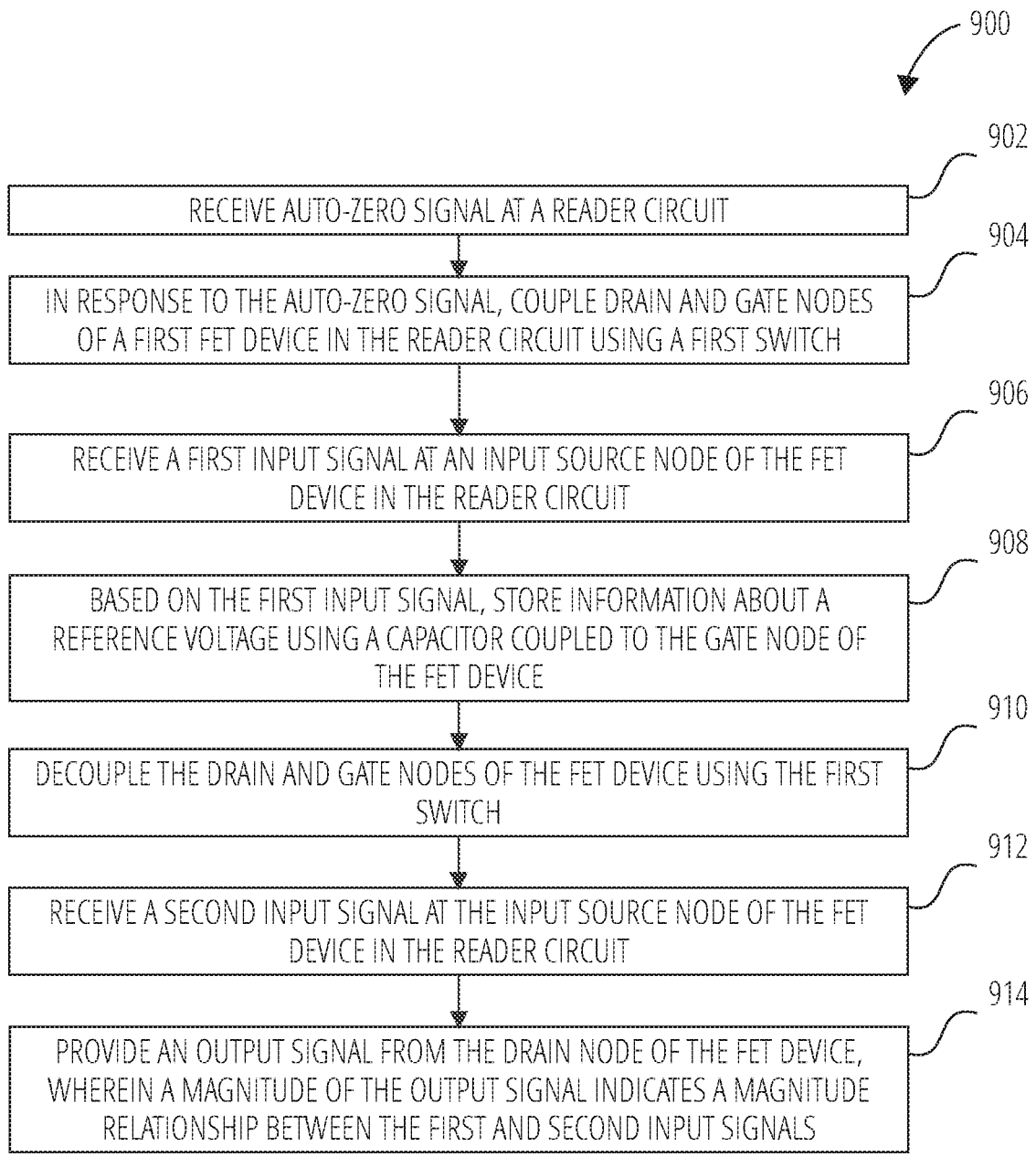
FIG. 9 illustrates generally a routine for determining a relationship between a first input signal and a second input signal using a common-gate FET device in accordance with one embodiment.

FIG. 9 illustrates generally an example of a signal comparison routine 900. The signal comparison routine 900 can be performed using a common-gate FET device that is configured to sense information about a reference signal magnitude during an auto-zero phase and compare it to a test signal magnitude during a test phase. The signal comparison routine 900 can be performed using a test system that can include one or more of the fuse reader system 100, the comparator 300, the resistor-comparator 400, the comparator 600, the first fuse reader 700, or the second fuse reader 800. The signal comparison routine 900 can begin with applying power to the test system.

At block 902, the signal comparison routine 900 can include receiving an auto-zero signal at a reader circuit. Block 902 can include receiving the auto-zero signal AZ at the reader circuit 104, for example from the control circuit 102. At block 904, in response to the auto-zero signal AZ, a common-gate FET device can be diode-connected using a first switch. For example, block 904 can include using the first switch 310 to diode-connect the first FET device 302 or using the drain-gate switch 610 to diode-connect the second FET device 602 in response to the auto-zero signal AZ being asserted.

At block 906, the signal comparison routine 900 can include receiving a first input signal at an input source node of the FET device in the reader circuit, such as in the reader circuit 104 from the example of FIG. 1. In an example, the first input signal can include a reference signal from a reference signal source, such as the reference source 106. At block 908, information about the reference signal can be stored, for example, using a capacitor that is coupled to the gate terminal of the common-gate FET device.

At block 910, the drain and gate nodes of the first FET device can be decoupled. For example, the auto-zero signal AZ can be unasserted or can change state and, in response, the first switch can open to thereby decouple drain and gate nodes of the common-gate FET device. At block 912 and after the auto-zero signal AZ is unasserted, a second input signal can be received at the input source node of the FET device in the reader circuit. The second input signal can represent, among other things, a fuse state or sensor status. In an example, the second input signal can include a voltage signal measured from a resistor or other device.

At block 914, the signal comparison routine 900 can include providing an output signal from the drain node of the first FET device. The output signal can indicate a magnitude relationship between the first and second input signals. For example, the output signal can represent whether a magnitude of the second input signal differs from a magnitude of the first input signal. In an example, the output signal can be substantially independent of a threshold-voltage or other characteristic of the first FET device.

Following block 914, the signal comparison routine 900 can optionally return to block 902 or can terminate by disconnecting power from the test system. In an example, the output signal provided at block 914 can be provided, for example, from the reader circuit 104 to the control circuit 102. In an example, the output signal from block 914 can include fuse state information and the fuse state information can be stored in a shadow RAM.

Figure 10:
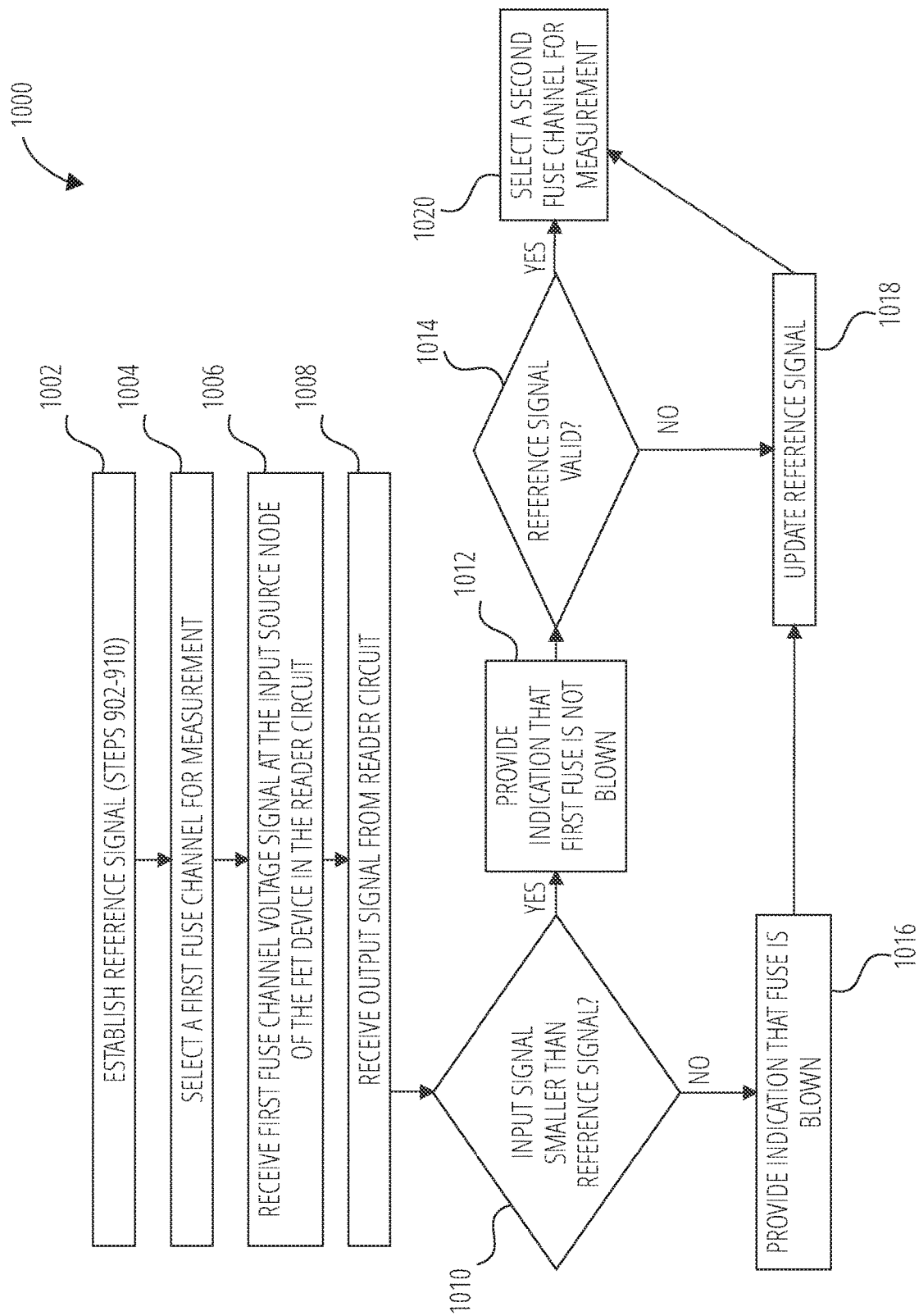
FIG. 10 illustrates generally a fuse reading routine in accordance with one embodiment.

FIG. 10 illustrates generally an example of a fuse reading routine 1000. The example of the fuse reading routine 1000 can be performed, for example, using the first fuse reader 700, the second fuse reader 800, or using one or more other fuse reader topologies.

In an example, at block 1002, the fuse reading routine 1000 can include establishing a reference signal against which one or more test signals can be compared. In an example, block 1002 can comprise performing the actions described herein at block 902, block 904, block 906, block 908, or block 910 from the signal comparison routine 900 of FIG. 9.

Block 1004 can include selecting a first fuse channel for measurement, such as during a measurement phase or test phase. In an example, block 1004 can include using the control circuit 102 to assert a read signal Read_x and the read signal Read_x can instruct the reader circuit 104 or the fuse bank 108 to couple a designated or specified fuse to, for example, the input node 604 of the second FET device 602.

At block 1006, the fuse reading routine 1000 can include receiving a voltage signal at an input node, for example at the input node 604. The voltage signal received at block 1006 can indicate a status or state of the designated or specified fuse from block 1004. For example, if the first fuse 704 is selected at block 1004, then the voltage signal received at block 1006 can include a voltage signal produced when a current signal, such as from the second current source 608, is provided through the second FET device 602 and to the first fuse 704. If the first fuse 704 is blown, then the voltage received at block 1006 can be high, and if the first fuse 704 is intact, then the voltage received at block 1006 can be low. At block 1008, an output signal can be received from the reader circuit, and the output signal can represent a magnitude relationship between the reference signal established in block 1002 and the voltage signal received at block 1006.

At decision block 1010, the output signal from block 1008 can be evaluated to determine the relationship between the reference signal from block 1002 and the voltage signal from block 1006. For example, at decision block 1010, if the output signal indicates that the first fuse channel voltage signal from block 1006 is less than the reference signal from block 1002, then the example can continue at block 1012. If the output signal indicates that the first fuse channel voltage signal from block 1006 is greater than the reference signal from block 1002, then the example can continue at block 1016.

At block 1016, the fuse reading routine 1000 can include providing an indication that the designated or specified fuse from block 1004 is blown. From block 1016, the fuse reading routine 1000 can continue at block 1018 to update the reference signal, such as by re-asserting the auto-zero signal AZ and measuring reference information from, for example, the reference source 106. Following block 1018, the fuse reading routine 1000 can continue at block 1020 by selecting a different second fuse channel to measure, such as using the control circuit 102 to assert a different read signal to address a different fuse in the fuse bank 108.

At block 1012, the fuse reading routine 1000 can include providing an indication that the designated or specified fuse from block 1004 is not blown or that the fuse is intact. From block 1012, the fuse reading routine 1000 can continue at decision block 1014 to determine whether the reference signal established at block 1002 is valid. The reference signal can be considered to be valid as long as the reference signal voltage, such as stored using the second capacitor 616, does not diminish or degrade by more than a specified threshold amount. That is, the integrity of the signal stored by the second capacitor 616 and available at the FET control node 614 can change over time, such as due to signal bleed through the second FET device 602 or other signal degradation, and decision block 1014 can be used to determine whether the reference signal should be updated. If the reference signal is determined at decision block 1014 to be invalid or insufficient, then the fuse reading routine 1000 can continue at block 1018 and the reference signal can be updated, for example, according to block 1002. If the reference signal is determined at decision block 1014 to be valid, however, then the fuse reading routine 1000 can continue at block 1020 without updating the reference signal.

Although the examples illustrated in the figures are generally presented as including FET devices, similar examples can be provided using BJT devices or other devices.

In an example, as mentioned previously, a problem to be solved includes providing a comparator or measurement circuit or fuse reader circuit. Various aspects of the present disclosure can help provide a solution to this and other problems associated with comparator circuits, measurement circuits, fuse reader circuits, and other circuits.

In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a common-gate amplifier circuit configured to provide information about a relationship between an input signal and a reference signal. In Aspect 1, the amplifier circuit can include a first FET including a first node, a second node, and a gate node, and an amplifier output node at the first node of the first FET. Aspect 1 can include a first switch configured to couple the first node and the gate node of the first FET when an auto-zero signal is asserted and the first switch is configured to decouple the first node and the gate node of the first FET when the auto-zero signal is unasserted, and a capacitor coupled to the gate node and configured to store information about the reference signal, wherein when the auto-zero signal is unasserted, an output signal at the output node can indicate a magnitude relationship between the input signal at the second node and the reference signal.

Aspect 2 can include or use, or can optionally be combined with the subject matter of Aspect 1, to optionally include or use a second switch configured to couple the second node of the first FET to receive the reference signal from a reference voltage source when the auto-zero signal is asserted and the second switch is configured to decouple the second node from the reference voltage source when the auto-zero signal is unasserted. Aspect 2 can further include a third switch configured to couple the second node of the first FET to receive the input signal from an input node when a read signal is asserted and the third switch is configured to decouple the second node from the input node when the read signal is unasserted.

Aspect 3 can include or use, or can optionally be combined with the subject matter of Aspect 2 to optionally include a first fuse coupled to the input node.

Aspect 4 can include or use, or can optionally be combined with the subject matter of Aspect 2 or Aspect 3 to optionally include or use a control circuit configured to provide the auto-zero signal to control the first and second switches and to provide the read signal to control the third switch.

Aspect 5 can include or use, or can optionally be combined with the subject matter of one or any combination of Aspects 1 through 4 to optionally include or use a second switch configured to couple the second node of the first FET to receive the reference signal from a reference voltage source when the auto-zero signal is asserted and the second switch is configured to decouple the second node from the reference voltage source when the auto-zero signal is unasserted, and multiple input switches configured to selectively couple the second node of the first FET to receive input signals from respective different input nodes in response to respective different read signals that control the multiple input switches.

Aspect 6 can include or use, or can optionally be combined with the subject matter of Aspect 5, to optionally include or use a control circuit configured to provide the respective different read signals that control the multiple input switches, wherein each of the read signals can be asserted at a different time.

Aspect 7 can include or use, or can optionally be combined with the subject matter of Aspect 6 to optionally include or use the control circuit to generate the auto-zero signal, and wherein the auto-zero signal and the respective different read signals can be asserted at different times.

Aspect 8 can include or use, or can optionally be combined with the subject matter of one or any combination of Aspects 1 through 7 to optionally include or use a second switch configured to couple the second node of the first FET to a reference voltage source when the auto-zero signal is asserted, and the reference voltage source can be configured to provide the reference signal.

Aspect 9 can include or use, or can optionally be combined with the subject matter of Aspect 8, to optionally include the reference voltage source comprising a resistor with a known resistance value.

Aspect 10 can include or use, or can optionally be combined with the subject matter of one or any combination of Aspects 1 through 9 to optionally include or use a current source configured to provide a current bias signal to the first node of the first FET.

Aspect 11 can include or use subject matter (such as an apparatus, a system, a device, a method, a means for performing acts, or a device readable medium including instructions that, when performed by the device, can cause the device to perform acts, or an article of manufacture), such as can include or use a system for determining a state of one or more fuses. Aspect 11 can include a first FET device, a first switch configured to selectively couple drain and gate nodes of the first FET device based on a first switch control signal, and a capacitor coupled to the gate node of the first FET device. In Aspect 11, the capacitor can be configured to store information about a reference signal when the first switch couples the drain and gate nodes of the first FET device and the reference signal is received at a source node of the first FET device. In Aspect 11, when the first switch decouples the drain and gate nodes of the first FET device and a second input signal is received at the source node of the first FRT device, an output signal at the drain node of the first FET device can indicate a magnitude relationship between the second input signal and the reference signal, and the second input signal can indicate a state of a first fuse.

Aspect 12 can include or use, or can optionally be combined with the subject matter of Aspect 11, to optionally include or use a second switch configured to couple the source node of the first FET device to a reference element that provides the reference signal, wherein the first and second switches can be closed or opened at substantially the same times.

Aspect 13 can include or use, or can optionally be combined with the subject matter of Aspect 12, to optionally include or use a third switch configured to couple the source node of the first FET device to the first fuse. In an example, the third switch can be closed only when the first and second switches are open.

Aspect 14 can include or use, or can optionally be combined with the subject matter of Aspect 13, to optionally include or use a control circuit to provide control signals to control an open/close status of each of the first, second, and third switches.

Aspect 15 can include or use, or can optionally be combined with the subject matter of one or any combination of Aspects 12 through 14 to optionally include or use multiple input switches configured to couple the source node of the first FET device to respective different fuses, wherein each of the multiple input switches can be closed at a different time (or closed for a different and non-overlapping interval), and wherein each of the multiple input switches can be open when the first and second switches are closed, and wherein the first fuse can comprise one of the fuses.

Aspect 16 can include or use, or can optionally be combined with the subject matter of one or any combination of Aspects 12 through 15 to optionally include or use a current source that is configured to provide a current bias signal to the drain node of the first FET device.

Aspect 17 can include or use subject matter (such as an apparatus, a system, a device, a method, a means for performing acts, or a device readable medium including instructions that, when performed by the device, can cause the device to perform acts, or an article of manufacture), such as can include or use a method for determining a relationship between a first input signal and a second input signal using a common-gate FET device. In an example, Aspect 17 can include or use, or can be combined with the subject matter of one or any combination of Aspects 1 through 16. In an example, the method of Aspect 17 can include steps or actions that include coupling drain and gate nodes of the FET device using a first switch, the first switch responsive to an auto-zero signal, and while the first input signal is applied to an input source node of the FET device, storing information about a reference voltage using a capacitor coupled to the gate node of the FET device. Aspect 17 can further include decoupling the drain and gate nodes of the FET device using the first switch, and, while the second input signal is applied to the input source node of the FET device, receiving an output signal from the drain node of the FET device, wherein a magnitude of the output signal can indicate a magnitude relationship between the first and second input signals.

Aspect 18 can include or use, or can optionally be combined with the subject matter of Aspect 17, to optionally include providing the second input signal to the input source node of the FET device, wherein the second input signal can represent or indicate a state of a fuse.

Aspect 19 can include or use, or can optionally be combined with the subject matter of Aspect 17, to optionally include providing the second input signal to the input source node of the FET device, wherein the second input signal can represent or indicate a sensor value.

Aspect 20 can include or use, or can optionally be combined with the subject matter of Aspect 17, to optionally include providing a first control signal for the first switch and providing a sequence of multiple other control signals for multiple other respective switches, wherein each of the multiple other respective switches couples a different fuse to the input source node of the FET device.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further; in an example, the code can be tangibly stored on one or more volatile, non-transitory, or non-volatile tangible computer-readable media; such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A comparator circuit configured to provide an output signal with information about a relationship between an input signal and a reference signal, the circuit comprising:
    a first FET including a first node, a second node, and a gate node, wherein the second node is configured to receive the input signal;
    an amplifier output node at the first node of the first FET, wherein the output signal at the output node indicates a magnitude relationship between the input signal at the second node and the reference signal;
    a first switch configured to couple the first node and the gate node of the first FET when a first comparator control signal is asserted and the first switch is configured to decouple the first node and the gate node of the first FET when the first comparator control signal is unasserted;
    a second switch configured to couple the second node of the first FET to receive the reference signal when the first comparator control signal is asserted and the second switch is configured to decouple the second node when the first comparator control signal is unasserted;
    a third switch configured to couple the second node of the first FET to receive the input signal from an input node when a second control signal is asserted and the third switch is configured to decouple the second node from the input node when the second control signal is unasserted; and
    a capacitor coupled to the gate node and configured to store information about the reference signal.

2. The comparator circuit of claim 1, further comprising:
    a reference voltage source, wherein the second switch is configured to couple the second node of the first FET to receive the reference signal from the reference voltage source.

3. The comparator circuit of claim 1, further comprising a first fuse coupled to the input node.

4. The comparator circuit of claim 1, further comprising a control circuit configured to provide the first comparator control signal to control the first and second switches and to provide the second control signal to control the third switch.

5. The comparator circuit of claim 1, further comprising:
    multiple input switches configured to selectively couple the second node of the first FET to receive input signals from respective different input nodes in response to respective different read signals that control the multiple input switches.

6. The comparator circuit of claim 5, further comprising a control circuit configured to provide the respective different read signals that control the multiple input switches, wherein each of the read signals is asserted at a different time.

7. The comparator circuit of claim 6, wherein the control circuit is configured to generate the first comparator control signal, and wherein the first comparator control signal and the respective different read signals are asserted at different times.

8. The comparator circuit of claim 2, wherein the reference voltage source comprises a resistor with a known resistance value.

9. The comparator circuit of claim 1, further comprising a current source configured to provide a current bias signal to the first node of the first FET.

10. A system for determining a state of one or more fuses, the system comprising:
a first FET device;
a first switch configured to selectively couple drain and gate nodes of the first FET device based on a first switch control signal;
a second switch configured to selectively couple a source node of the first FET device to a reference signal source; and
a capacitor coupled to the gate node of the first FET device;
wherein the capacitor stores information about a reference signal when the first switch couples the drain and gate nodes of the first FET device and the reference signal is received via the second switch at the source node of the first FET device; and
wherein an output signal at the drain node of the first FET device indicates a magnitude relationship between a second input signal and the reference signal when the first switch decouples the drain and gate nodes of the first FET device, the second switch decouples the source node of the first FET from the reference signal source, and the source node of the first FET device receives the second input signal via a third switch;
wherein the second input signal inicates a state of a first fuse.

11. The system of claim 10, wherein the second switch is configured to couple the source node of the first FET device to a reference element that provides the reference signal, and wherein the first and second switches are closed or opened at substantially the same times.

12. The system of claim 10, further comprising multiple input switches configured to couple the source node of the first FET device to respective different fuses, wherein each of the multiple input switches is closed at a different time, and wherein each of the multiple input switches is open when the first and second switches are closed, and wherein the first fuse comprises one of the fuses.

13. The system of claim 10, further comprising a current source configured to provide a current bias signal to the drain node of the first FET device.

14. A method for determining a relationship between a first input signal and a second input signal using a common-gate PET device, the method comprising:
in a reference phase:
coupling drain and gate nodes of the FET device using a first switch, the first switch responsive to an auto-zero signal;
coupling an input source node of the FET device to receive the first input signal using a second switch, and storing information about a reference voltage using a capacitor coupled to the gate node of the FET device; and
in a read phase:
decoupling the drain and gate nodes of the FET device using the first switch;
coupling the input source node of the FET device to receive the second input signal using a third switch; and
while the second input signal is applied to the input source node of the PET device, receiving an output signal from the drain node of the PET device, wherein a magnitude of the output signal indicates a magnitude relationship between the first and second input signals.

15. The method of claim 14, further comprising providing the second input signal to the input source node of the FET device; wherein the second input signal represents a state of a fuse.

16. The method of claim 14, further comprising providing the second input signal to the input source node of the PET device, wherein the second input signal represents a sensor value.

17. The method of claim 14, further comprising providing a first control signal for the first switch and providing a sequence of multiple other control signals for multiple other respective switches, wherein each of the multiple other respective switches couples a different fuse to the input source node of the FET device.

* * * * *

UNITED STATES PATENT AND TRADEMARK OFFICE
CERTIFICATE OF CORRECTION

PATENT NO. : 10,854,306 B1
APPLICATION NO. : 16/576216
DATED : December 1, 2020
INVENTOR(S) : Samuels et al.

Page 1 of 1

It is certified that error appears in the above-identified patent and that said Letters Patent is hereby corrected as shown below:

In the Claims

In Column 19, Line 41, in Claim 10, delete "inicates" and insert --indicates-- therefor In Column 20, Line 13, in Claim 14, delete "PET" and insert --FET-- therefor In Column 20, Line 30, in Claim 14, delete "PET" and insert --FET-- therefor In Column 20, Line 31, in Claim 14, delete "PET" and insert --FET-- therefor In Column 20, Line 36, in Claim 15, delete "device;" and insert --device,-- therefor In Column 20, Line 39, in Claim 16, delete "PET" and insert --FET-- therefor Signed and Sealed this
Second Day of March, 2021

Drew Hirshfeld
*Performing the Functions and Duties of the*
*Under Secretary of Commerce for Intellectual Property and*
*Director of the United States Patent and Trademark Office*